(12) United States Patent
Maida et al.

(10) Patent No.: US 7,795,974 B2
(45) Date of Patent: Sep. 14, 2010

(54) DIGITALLY VARIABLE GAIN AMPLIFIER USING MULTIPLEXED GAIN BLOCKS

(75) Inventors: Michael X. Maida, San Jose, CA (US); Gertjan Van Sprakelaar, Fremont, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 12/429,984

(22) Filed: Apr. 24, 2009

(65) Prior Publication Data

US 2009/0267692 A1    Oct. 29, 2009

Related U.S. Application Data

(60) Provisional application No. 61/048,144, filed on Apr. 25, 2008.

(51) Int. Cl.
*H03F 3/45* (2006.01)
(52) U.S. Cl. .......................... 330/254; 330/69
(58) Field of Classification Search ................. 330/254, 330/257, 261, 258, 69
See application file for complete search history.

(56) References Cited

U.S. PATENT DOCUMENTS

| 5,757,233 | A  | * | 5/1998  | Kato et al. | 330/254 |
| 6,316,997 | B1 | * | 11/2001 | Tammone, Jr. | 330/254 |
| 7,560,986 | B2 | * | 7/2009  | Kocaman | 330/254 |

* cited by examiner

*Primary Examiner*—Henry K Choe

(57) ABSTRACT

A digitally variable gain amplifier comprising a front-end stage, a level shifter stage, and an output amplifier stage. The front-end stage comprises a high gain pre-amplifier and a low gain pre-amplifier driven in parallel by a differential input signal. A coarse gain control is realized by enabling only one pre-amplifiers at a time, while the differential input signal remains connected to the inputs of the disabled pre-amplifier. An attenuator following each pre-amplifier provides fine gain control. The enabled pre-amplifier amplifies the differential input signal and outputs a first dc voltage level. The disabled pre-amplifier is placed into a standby ready mode and outputs a second dc voltage level that is greater in magnitude than the first dc voltage level. The level shifter stage performs a minimum voltage selection operation to automatically select and level shift the amplified differential input signal, and further pass the signal to the output amplifier stage.

20 Claims, 7 Drawing Sheets

DIGITALLY VARIABLE GAIN AMPLIFIER USING MULTIPLEXED GAIN BLOCKS

CROSS REFERENCE TO RELATED APPLICATIONS

This application claims the benefit under 35 U.S.C. §119(e) of the U.S. provisional application No. 61/048,144, filed Apr. 25, 2008.

BACKGROUND

A high-speed variable gain amplifier (VGA) requires fast bipolar transistors to meet bandwidth and linearity requirements. A VGA comprising a front-end amplifier followed by an attenuator cannot meet the dynamic range requirement; therefore front-end gain must be switched. However, CMOS switches cannot be connected directly to the input signal due to voltage limitations, so they cannot be used to switch an input signal directly to high-impedance amplifier input terminals. Furthermore, the use of CMOS switches to switch low impedance components, such as gain-setting resistors, may distort frequency response due to CMOS switch non-linear resistance and capacitance.

DESCRIPTION OF THE DRAWINGS

Aspects of the present disclosure may be more completely understood in consideration of the following detailed description of various embodiments in connection with the accompanying drawings.

DETAILED DESCRIPTION

Figure 1:
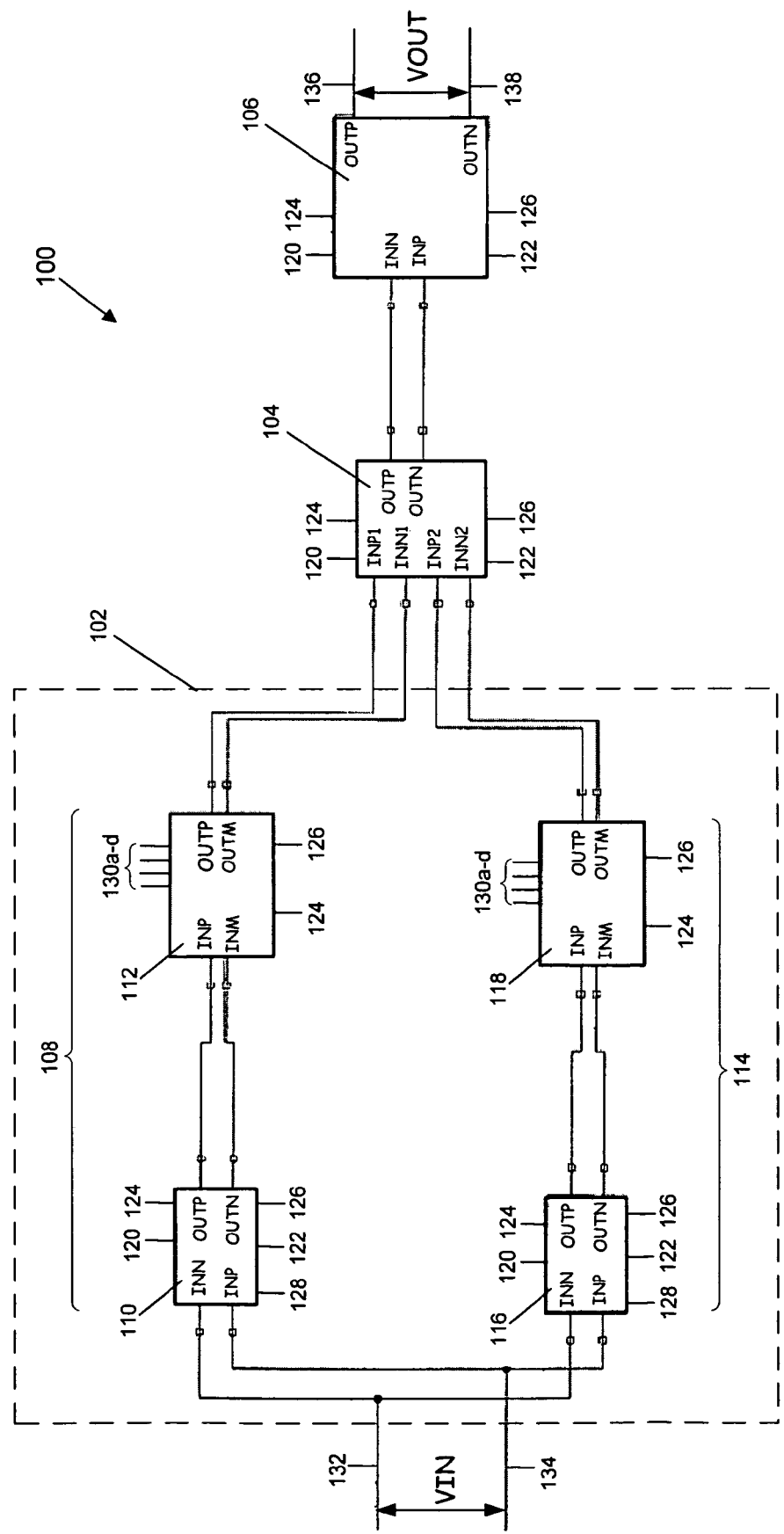
FIG. 1 is a schematic block diagram of an example circuit configured as a digitally variable gain amplifier according to the principles of the present disclosure.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference. The meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

The present disclosure for a preferred embodiment relates to a high-speed BiCMOS digitally variable gain amplifier comprising a front-end amplification stage, a level shifter stage, and an output amplifier stage. The front-end amplification stage comprises a high gain pre-amplifier and a low gain pre-amplifier driven in parallel by a differential input signal. A coarse gain control mechanism is realized by enabling only one of the pre-amplifiers at a time, while the differential input signal remains connected to the inputs of the disabled pre-amplifier. A step attenuator following each pre-amplifier provides a fine gain control mechanism.

The enabled pre-amplifier amplifies the differential input signal and further outputs a first dc voltage level. The disabled pre-amplifier is placed into a standby ready mode that maintains safe transistor operating points (for example, by keeping internal low voltage devices in a safe operating region), thereby preventing internal voltage drift and minimizing non-ideal loading effects as the differential input signal always remains connected to each respective pre-amplifier. The disabled pre-amplifier additionally outputs a second dc voltage level that is greater in magnitude than the first dc voltage level. The level shifter stage performs a minimum voltage selection operation to automatically select the amplified differential input signal from the enabled pre-amplifier by virtue of the different first and second dc voltage levels. The level shifter stage additionally shifts the dc voltage level of the selected differential input signal to condition the signal for the output amplifier stage. The output amplifier stage amplifies the differential input signal and transmits the signal to other circuitry as desired.

Although not so limited, an appreciation of the various aspects of the disclosure will be gained through a discussion of the examples provided below.

FIG. 1 is a schematic block diagram of an example circuit 100 configured as a digitally variable gain amplifier according to the principles of the present disclosure. Example circuit 100 comprises a pre-amplifier stage 102, a level shifter stage 104, and an output amplifier stage 106. An example pre-amplifier stage 102 includes a first signal gain path 108 comprising a first pre-amplifier 110 coupled to a first attenuator 112, and a second signal gain path 114 comprising a second pre-amplifier 116 coupled to a second attenuator 118. Other embodiments of the example pre-amplifier stage 102 are possible as well. For example, pre-amplifier stage 102 may include any number of signal gain paths that are configured similar to the first signal gain path 108 and the second signal gain paths 114, respectively.

Each respective pre-amplifier 110, 116 includes a pair of input terminals (INN and INP), a pair of output terminals (OUTP and OUTN), a first supply terminal 120 (VCC), a first supply ground terminal 122, a second supply terminal 124 (VDD), a second supply ground terminal 126, and an enable terminal 128. Other embodiments are possible as well. For example, the first pre-amplifier 110 and/or the second pre-amplifier 116 may include one or more additional terminals to accommodate for any circuitry relevant to amplifier applications such as, for example, control logic, level shifting, biasing, compensation, filtering, and others.

The output terminals (OUTP and OUTN) of the first pre-amplifier 110 are coupled to a pair of corresponding input terminals (INP and INM) of the first attenuator 112. The output terminals (OUTP and OUTN) of the second pre-amplifier 116 are coupled to a pair of corresponding input terminals (INP and INM) of the second attenuator 118. The first and second attenuator 112, 118 each additionally include a pair of output terminals (OUTP and OUTM), a second supply terminal 124 (VDD), a second supply ground terminal 126, and a plurality of fine gain control terminals 130a-d. Other embodiments are possible as well. For example, the first attenuator 112 and/or the second attenuator 118 may include one or more additional terminals to accommodate for other circuitry as desired.

The output terminals (OUTP and OUTM) of the first attenuator 112 are coupled to corresponding input terminals (INP1 and INN1) of the level shifter stage 104. The output terminals (OUTP and OUTM) of the second attenuator 118 are coupled to corresponding input terminals (INP2 and INN2) of the level shifter stage 104. The level shifter stage 104 additionally includes a pair of output terminals (OUTP and OUTN), a first supply terminal 120 (VCC), a first supply ground terminal 122, a second supply terminal 124 (VDD), a second supply ground terminal 126. However, other embodiments of the level shifter stage 104 are possible as well. For example, level shifter stage 104 may include one or more additional terminals to accommodate for control logic, level shifting circuitry, bias circuitry, and any other circuitry as desired.

In certain embodiments, the first and second attenuator 112, 118 are omitted from example circuit 100. In the example embodiment, the output terminals (OUTP and OUTN) of the first pre-amplifier 110 are directly connected to the input terminals (INP1 and INN1) of the level shifter stage 104. Similarly, the output terminals (OUTP and OUTN) of the second pre-amplifier 116 are directly connected to the input terminals (INP2 and INN2) of the level shifter stage 104. Other embodiments are possible as well. For example, circuit 100 may include one or more pre-amplifiers that are directly connected to the level shifter stage 104, and additionally include one or more pre-amplifiers that are connected to the level shifter stage 104 via an attenuator.

The output terminals (OUTP and OUTN) of the level shifter stage 104 are coupled to a pair of corresponding input terminals (INN and INP) of the output amplifier stage 106. The output amplifier stage 106 further includes a pair of output terminals (OUTP and OUTN), a first supply terminal 120 (VCC), a first supply ground terminal 122, a second supply terminal 124 (VDD), a second supply ground terminal 126. Other embodiments of output amplifier stage 106 are possible as well. For example, the output amplifier stage 106 may include one or more additional terminals to accommodate for any circuitry relevant to amplifier applications such as, for example, control logic, level shifting, biasing, compensation, filtering, and others.

Example circuit 100 is configured to operate as follows below. A first supply signal (VCC) is applied to the first supply terminal 120 of respective stages 102, 104, and 106. A second supply signal (VDD) is applied to second supply terminal 124 of stages 102, 104, and 106. A differential input signal (VIN) is applied between a Vin$^+$ signal trace 132 and a Vin$^-$ signal trace 134. The Vin$^+$ signal trace 132 is connected to the INN input terminal of the first and second pre-amplifiers 110, 116. Similarly, the Vin$^-$ signal trace 134 is connected to the INP input terminal of the respective pre-amplifiers 110, 116. According to the principles of the present disclosure, the differential input signal (VIN) remains connected to the respective inputs of both the first amplifier 110 and the second pre-amplifier 116 at all times during operation of example circuit 100.

A control signal is applied to the enable terminal 128 of the first and second pre-amplifier 110, 116 by external control logic (not shown). The control signal places one of the respective pre-amplifiers 110, 116 in a fully operational active mode, while the remaining one of the respective pre-amplifiers 110, 116 is simultaneously placed into a quiescent standby ready mode. The one of the respective pre-amplifiers 110, 116 selected to operate in the active mode is supplied full supply current to amplify the applied differential input signal (VIN) by the corresponding gain factor, and further to output a first dc voltage level. In example embodiments, the first dc voltage level is approximately 1.2V. In contrast, the standby ready mode disables the remaining one of the respective pre-amplifiers 110, 116 by restricting supply current such that signal amplification does not occur. Rather, the disabled pre-amplifier is placed into the standby ready mode that maintains safe transistor operating points and automatically puts internal low voltage devices in a safe operating protected mode. Further, the disabled pre-amplifier outputs a second dc voltage level that is greater in magnitude than the first dc voltage level. In certain embodiments, the second dc voltage level is approximately 1.9V.

Use of the control signal as described enables realization of a course gain control mechanism, as a gain factor of the first pre-amplifier 110 is typically set to a value that is different from a gain factor of the second pre-amplifier 116. For example, in one embodiment, the gain factor of the first pre-amplifier 110 may be set to 10 dB, and the gain factor of the second pre-amplifier 116 may be set to 30 dB.

Both the first and second pre-amplifier 110, 116 pass a signal to the corresponding first and second attenuator 112, 118. The one pre-amplifier in the active mode passes the amplified differential input signal (VIN) and the first dc voltage to the corresponding attenuator. Similarly, the one pre-amplifier in the standby ready mode passes any small signal noise and the second dc voltage level to the corresponding attenuator. A control signal is applied to the fine gain set terminals 130a-d (i.e., a digital word) of the attenuator associated with the one pre-amplifier in the active mode by external control logic (not shown). In this manner, a fine gain control mechanism is realized by selectively setting a desired signal attenuation factor.

In certain embodiments, the first attenuator 112 and second attenuator 118 are implemented as a resistive ladder configured to provide a gain step resolution of 2 dB. In the example embodiment, attenuation is set by selection of a specific tap voltage with a CMOS switch. Accordingly, the first dc voltage level of approximately 1.2V enables the use of fast NMOS devices. It will be appreciated that other embodiments of the first and second attenuators 112, 118 are possible as well. For example, the respective attenuators 112, 118 can be configured to provide any desired gain step resolution.

Both the first and second attenuators 112, 118 pass a signal from the respective output terminals (OUTP and OUTM) to the corresponding input terminals (INP1 and INN1) and (INP2 and INN2) of the level shifter stage 104. In one embodiment, the level shifter stage 104 is configured to automatically select the amplified differential input signal (VIN) from the one pre-amplifier in the active mode by performing a minimum dc voltage selection operation. In the example embodiment, the first dc voltage level of approximately 1.2V corresponding to a pre-amplifier in the active mode would be selected over the second dc voltage level of approximately 1.9V. Other embodiments are possible as well. For example, in one embodiment, the level shifter stage 104 is configured to automatically select the amplified differential input signal (VIN) from the one pre-amplifier in the active mode by performing a maximum dc voltage selection operation.

In addition to selecting the amplified differential input signal (VIN), the level shifter stage 104 adjusts the dc voltage level of differential input signal (VIN), and passes the amplified and level shifted differential input signal (VIN), to the input terminals (INN and INP) of the output amplifier stage 106. The output amplifier stage 106 conditions (VIN) as desired, and outputs the conditioned signal to the output terminals (OUTP and OUTN) as a differential output signal (VOUT). (VOUT) is applied between a Vout$^+$ signal trace 136 and a Vout$^-$ signal trace 138 that couples (VOUT) to further circuitry as desired. For example, in digital oscilloscope application, (VOUT) may be coupled to input terminals of an A/D converter (not shown).

Figure 2:
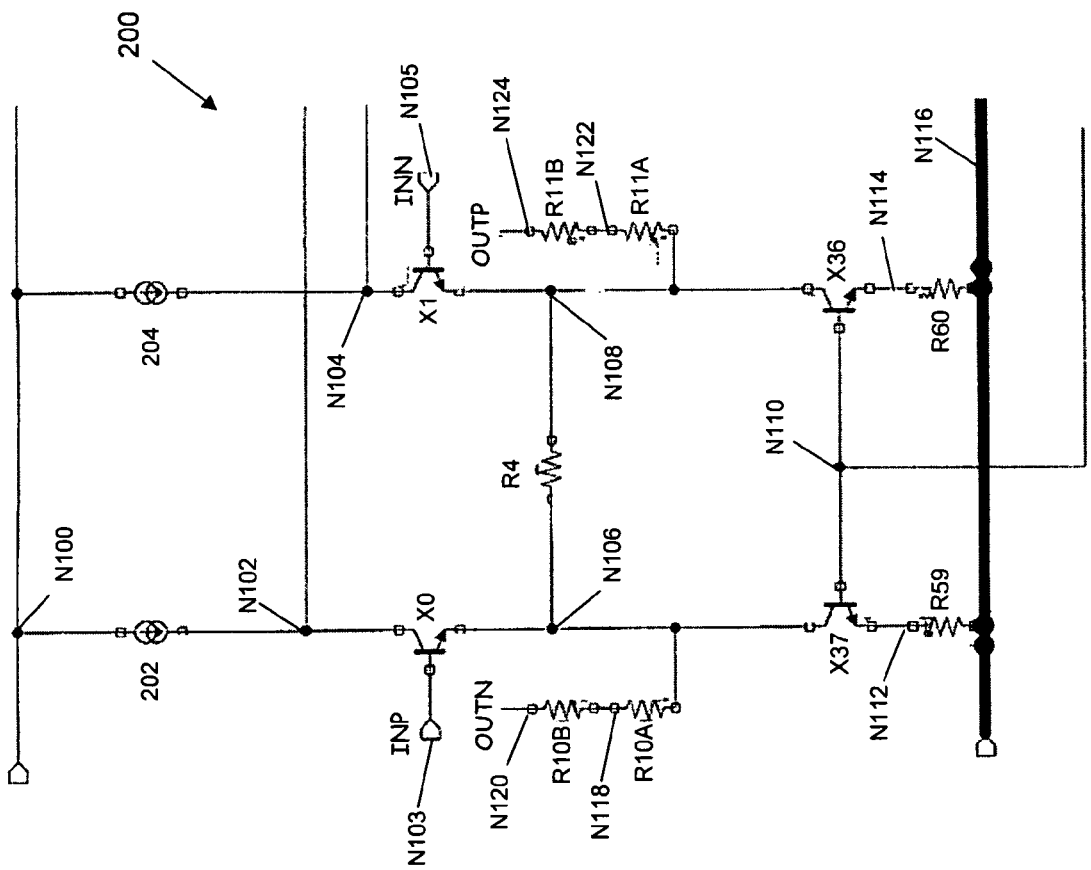
FIG. 2 is a schematic diagram of an example circuit implementation of a first stage of an example amplifier block as shown in FIG. 1.
Figure 3:
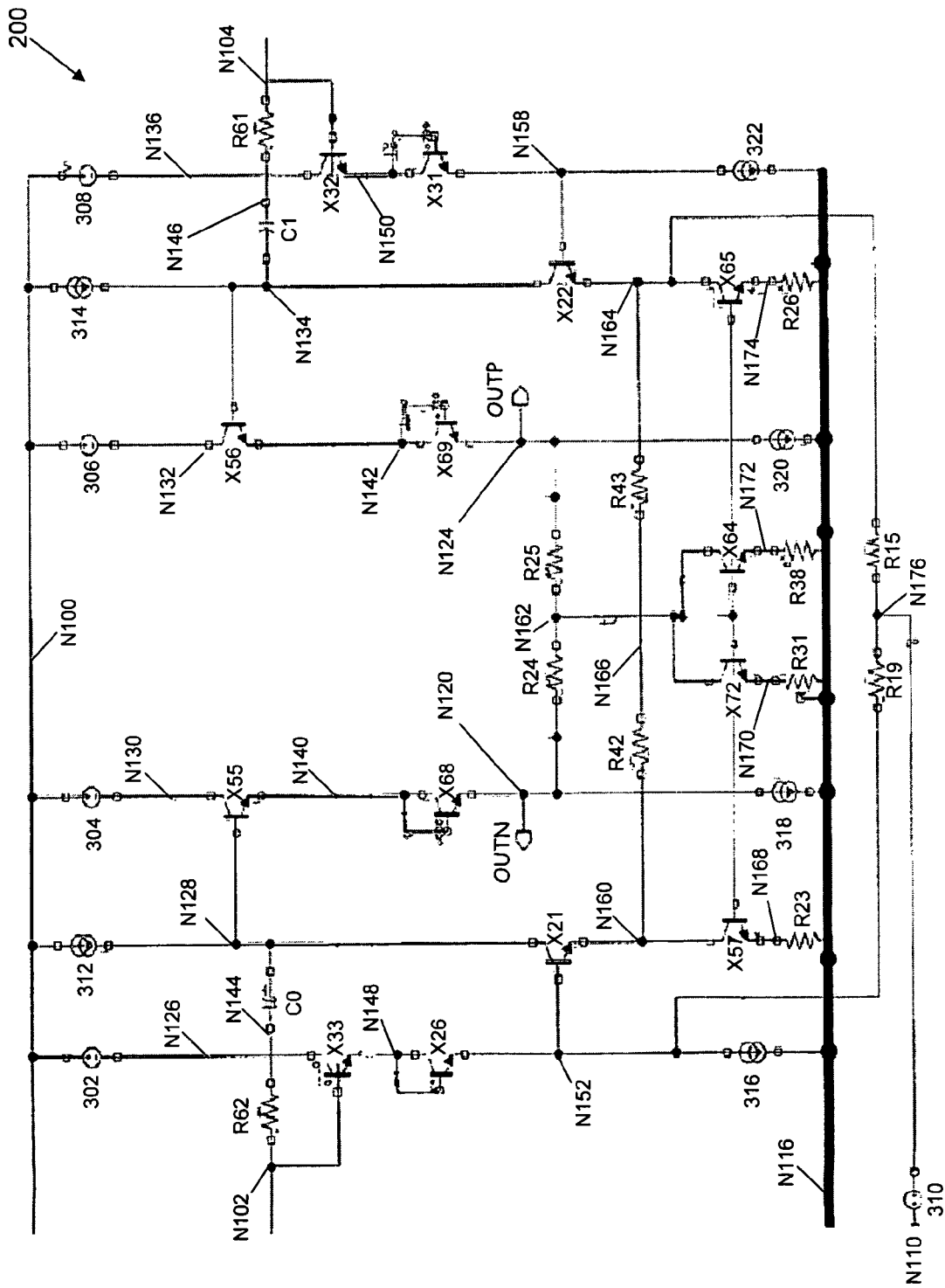
FIG. 3 is a schematic diagram of an example circuit implementation of a second stage of the example amplifier block of FIG. 2.

Referring now to FIG. 2 and FIG. 3, a schematic diagram of an example circuit implementation 200 of first pre-amplifier 110 of FIG. 1 is shown. In certain embodiments, second pre-amplifier 116 and output amplifier stage 106 are configured similar to example circuit implementation 200.

FIG. 2. is an example first stage of circuit implementation 200 that is configured as a differential pair amplification stage. Example first stage comprises a plurality of current sources 202, 204, a dc voltage source 310 (see FIG. 3), a plurality of transistors X0, X1, X36, X37, and a plurality of resistors R4, R10A, R10B, R11A, R11B, R15 (see FIG. 3), R19 (see FIG. 3), R59, and R60. Other embodiments of example first stage are possible as well.

Current source 202 has a first terminal coupled to a supply node N100 (VCC) and a second terminal coupled to a node N102. Current source 204 has a first terminal coupled to node N100 and a second terminal coupled to a node N104.

Transistor X0 has a collector that is coupled to node N102, an emitter that is coupled to a node N106, and a base that is coupled to a node N103. In example embodiments, node N103 corresponds to the INP input terminal of first pre-amplifier 110. Transistor X1 has a collector that is coupled to node N104, an emitter that is coupled to a node N108, and a base that is coupled to a node N105. In example embodiments, node N105 corresponds to the INN input terminal of first pre-amplifier 110. Transistor X36 has a collector that is coupled to node N108, an emitter that is coupled to a node N110, and a base that is coupled to a node N114. Transistor X37 has a collector that is coupled to node N106, an emitter that is coupled to node N110, and a base that is coupled to a node N112.

Input degeneration resistor R4 has a first terminal coupled to node N106 and a second terminal coupled to node N108. Resistor R10A has a first terminal coupled to node N106 and a second terminal coupled to a node N118. Resistor R10B has a first terminal coupled to node N118 and a second terminal coupled to a node N120. In example embodiments, node N120 corresponds to the OUTN output terminal of the first pre-amplifier 110.

Resistor R11A has a first terminal coupled to node N108 and a second terminal coupled to a node N122. Resistor R11B has a first terminal coupled to node N122 and a second terminal coupled to a node N124. In example embodiments, node N124 corresponds to the OUTP output terminal of the first pre-amplifier 110. Resistor R59 has a first terminal coupled to node N112 and a second terminal coupled to a ground node N116. Resistor R60 has a first terminal coupled to node N114 and a second terminal coupled to node N116.

FIG. 3. illustrates an example second stage of circuit implementation 200 that is configured as a second differential pair amplification stage and an output stage. Example second stage comprises a plurality of dc voltage sources 302, 304, 306, 308, a plurality of current sources 312, 314, 316, 318, 320, and 322, a plurality of transistors X21, X22, X26, X31, X32, X33, X55, X56, X57, X64, X65, X68, X69, X72, a plurality of resistors R15, R19, R23, R24, R25, R26, R31, R38, R42, R43, R61, R62, and a plurality of capacitors C0, C1.

DC voltage source 302 has a first terminal coupled to node N100 and a second terminal coupled to a node N126. DC voltage source 304 has a first terminal coupled to node N100 and a second terminal coupled to a node N130. DC voltage source 306 has a first terminal coupled to node N100 and a second terminal coupled to a node N132. DC voltage source 308 has a first terminal coupled to node N100 and a second terminal coupled to node a N136. DC voltage source 310 has a first terminal coupled to node N110 and a second terminal coupled to a node N176.

Current source 312 has a first terminal coupled to node N100 and a second terminal coupled to a node N128. Current source 314 has a first terminal coupled to node N100 and a second terminal coupled to a node N134. Current source 316 has a first terminal coupled to a node N152 and a second terminal coupled to node N116. Current source 318 has a first terminal coupled to node N120 and a second terminal coupled to node N116. Current source 320 has a first terminal coupled to node N124 and a second terminal coupled to node N116. Current source 322 has a first terminal coupled to a node N158 and a second terminal coupled to node N116.

Transistor X21 has a collector that is coupled to node N128, an emitter that is coupled to node a N160, and a base that is coupled to node a N152. Transistor X22 has a collector that is coupled to node N134 an emitter that is coupled to a node N164, and a base that is coupled to node N158. Transistor X26 has a collector that is coupled to a node N148, an emitter that is coupled to node N152, and a base that is coupled to node N148. Transistor X31 has a collector that is coupled to a node N150, an emitter that is coupled to node N158, and a base that is coupled to node N150.

Transistor X32 has a collector that is coupled to node N136, an emitter that is coupled to node N150, and a base that is coupled to node N104. Transistor X33 has a collector that is coupled to node N126, an emitter that is coupled to node N148, and a base that is coupled to node N102. Transistor X55 has a collector that is coupled to node N130, an emitter that is coupled to a node N140, and a base that is coupled to node N128. Transistor X56 has a collector that is coupled to node N132, an emitter that is coupled to a node N142, and a base that is coupled to node N134. Transistor X57 has a collector that is coupled to node N160, an emitter that is coupled to a node N168, and a base that is coupled to a node N162.

Transistor X64 has a collector that is coupled to node N162, an emitter that is coupled to a node N172, and a base that is coupled to node N162. Transistor X65 has a collector that is coupled to node N164, an emitter that is coupled to a node N174, and a base that is coupled to node N162. Transistor X68 has a collector that is coupled to node N140, an emitter that is coupled to node N120, and a base that is coupled to node N140. Transistor X69 has a collector that is coupled to node N142, an emitter that is coupled to node N124, and a base that is coupled to node N142. Transistor X72 has a collector that is coupled to node N162, an emitter that is coupled to a node N170, and a base that is coupled to node N162.

Resistor R15 has a first terminal coupled to node N164 and a second terminal coupled to node N176. Resistor R19 has a first terminal coupled to node N152 and a second terminal coupled to node N176. Resistor R23 has a first terminal coupled to node N168 and a second terminal coupled to node N116. Resistor R24 has a first terminal coupled to node N120 and a second terminal coupled to node N162. Resistor R25 has a first terminal coupled to node N162 and a second terminal coupled to node N124. Resistor R26 has a first terminal coupled to node N174 and a second terminal coupled to node N116.

Resistor R31 has a first terminal coupled to node N170 and a second terminal coupled to node N116. Resistor R38 has a first terminal coupled to node N172 and a second terminal coupled to node N116. Resistor R42 has a first terminal coupled to node N160 and a second terminal coupled to node N166. Resistor R43 has a first terminal coupled to node N166 and a second terminal coupled to node N164. Resistor R61 has a first terminal coupled to node N146 and a second terminal coupled to node N104. Resistor R62 has a first terminal coupled to node N144 and a second terminal coupled to node N102.

Capacitor C0 has a first terminal coupled to node N144 and a second terminal coupled to node N128. Capacitor C1 has a first terminal coupled to node N134 and a second terminal coupled to node N146.

Example circuit implementation 200 of first pre-amplifier 110 as shown in FIG. 2 and FIG. 3 is configured to operate as follows. Transistors X0 and X1 form an input stage differential pair. The output terminals of X0 and X1 are buffered by emitter followers X33 and X22. Transistors X21 and X22 form the second stage differential pair. Level shifting to correct voltage levels from the input stage differential pair to the second stage differential pair is performed via transistors X33 and X32 and corresponding diode-connected transistors X26 and X31. Emitter followers X55 and X56 and corresponding diode-connected transistors X68 and X69 form the output stage Gain is set by a ratio of the input degeneration resistor R4 and feedback resistors (R10A+R10B) and (R11A+R11B). In example embodiments, feedback resistors (R10A+R10B) and (R11A+R11B) are coupled to the respective low impedance emitter of transistors X68 and X69. According to the principles of the present disclosure, example circuit implementation 200 leverages current feedback to achieve a high slew rate to faithfully amplify and represent a very high speed input signal (i.e., 500 MHz).

Figure 4:
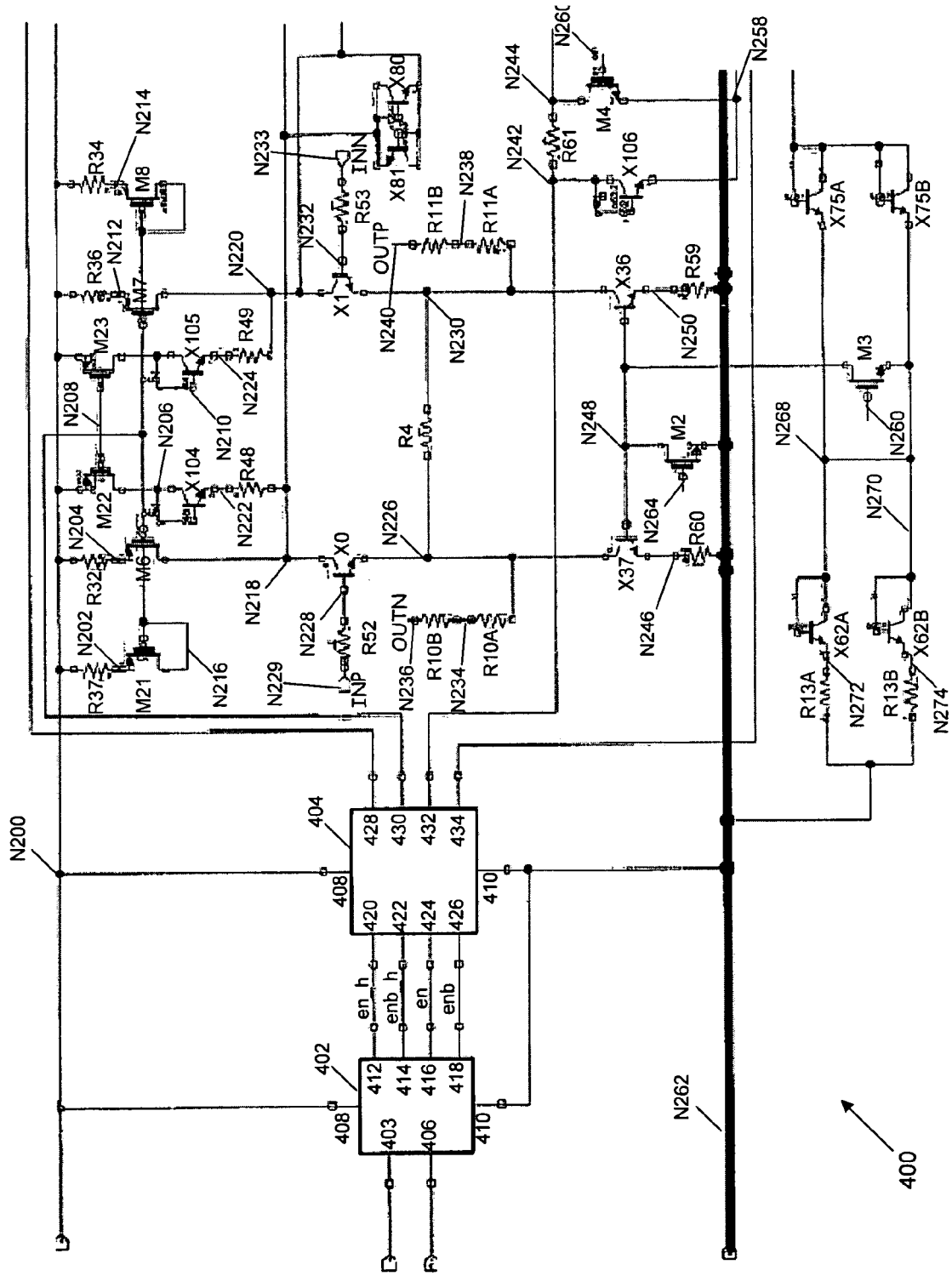
FIG. 4 is a schematic diagram of another example circuit implementation of a first stage of an example amplifier block as shown in FIG. 1.
Figure 5:
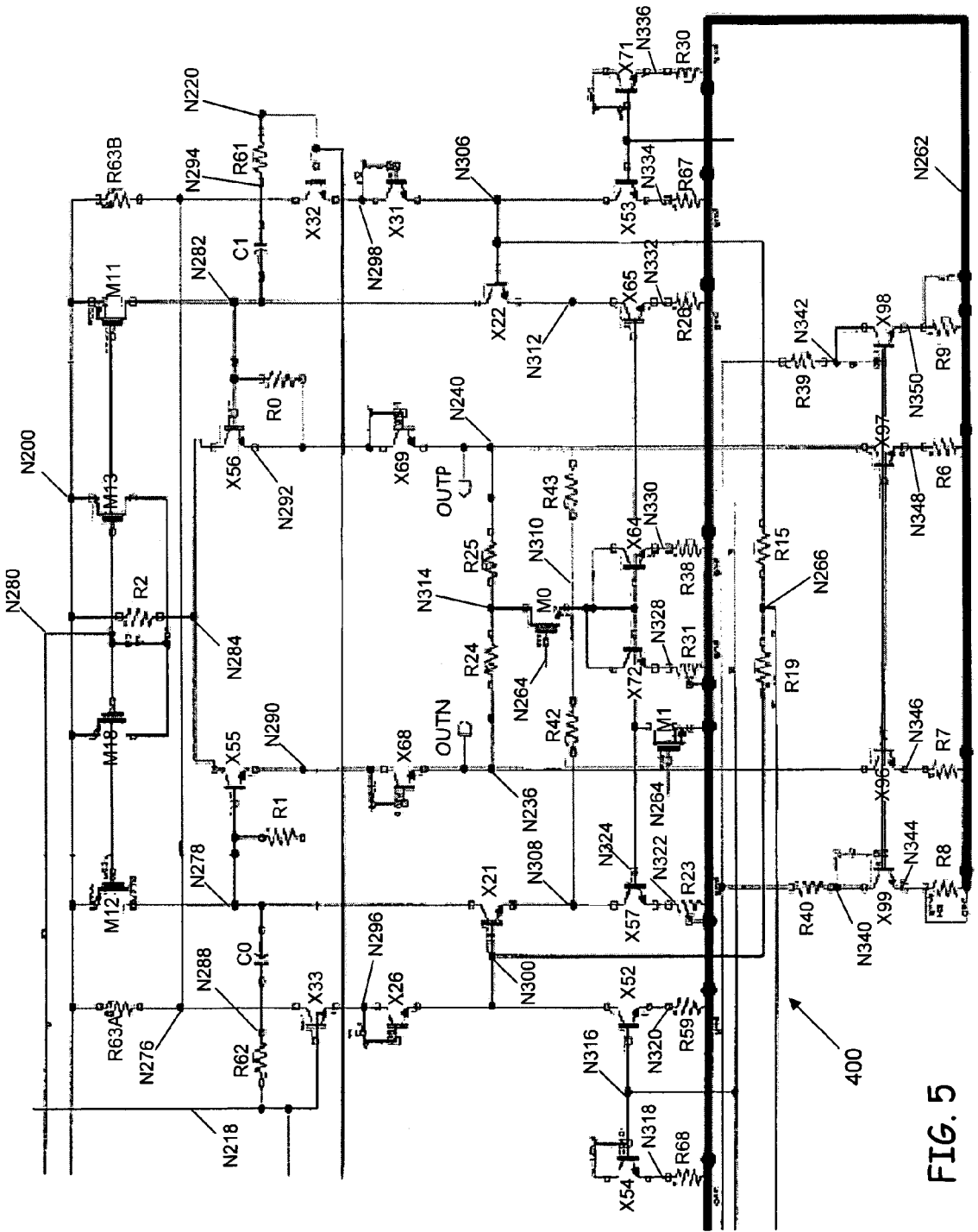
FIG. 5 is a schematic diagram of another example circuit implementation of a second stage of the example amplifier block of FIG. 4.

Referring now to FIG. 4 and FIG. 5, a schematic diagram of another example circuit implementation 400 of first pre-amplifier 110 of FIG. 1 is shown. Example circuit implementation 400 is configured similar to the example circuit implementation 200 as described above. However, as described further below, example circuit implementation 400 includes a plurality of additional circuitry to switch between an active mode and a standby ready mode according to the principles of the present disclosure. In certain embodiments, the second pre-amplifier 116 and the output amplifier stage 106 are configured similar to example circuit implementation 400.

FIG. 4. illustrates an example first stage of circuit implementation 400 that is configured as a differential pair amplification stage comprising a plurality of transistors M2, M3, M4, M6, M7, M8, M21, M22, M23, X0, X1, X36, X37, X62A, X62B, X75A, X75B, X81, X80, X104, X105, X106 and plurality of resistors R4, R10A, R10B, R11A, R11B, R13A, R13B, R32, R34, R36, R37, R48, R49, R52, R53, R59, R60, R61.

Example first stage further comprises a first biasing block 402 and a second biasing block 404 that are configured to perform a logic level shift operation to translate logic voltage levels (described below with respect to FIG. 7), and further switch a magnitude of bias current applied to the circuitry of example circuit implementation 400 when first pre-amplifier 110 is switched between an active mode (i.e., enabled) and a standby ready mode (i.e., disabled).

First biasing block 402 includes an en_in control terminal 406, a first supply terminal 408 (VCC), a second supply terminal 403 (VDD), a ground terminal 410, an en_h output terminal 412, an enb_h output terminal 414, an en output terminal 416, an enb output terminal 418. The en_h output terminal 412 is coupled to an en_h input terminal 420 of second biasing block 404. Similarly, enb_h output terminal 414, en output terminal 416, and enb output terminal 418 of second biasing block 404 are coupled to a corresponding enb_h output terminal 422, an en output terminal 424, and an enb output terminal 426 of second biasing block 404. Second biasing block 404 further comprises a first bias current output terminal 428, a second bias current output terminal 430, a third bias current output terminal 432, a fourth bias current output terminal 434, a first supply terminal 408, and a ground terminal 410.

Transistor M2 has a source that is coupled to a ground node N262, a drain that is coupled to a node N248, and a gate that is coupled to a disable control node N264. Transistor M3 has a source that is coupled to a node N270, a drain that is coupled to node N248, and a gate that is coupled to an enable control node N260. Transistor M4 has a source that is coupled to a node N258, a drain that is coupled to a node N244, and a gate that is coupled to disable control node N260. Transistor M6 has a source that is coupled to a node N204, a drain that is coupled to a node N218, and a gate that is coupled to a node N216. Transistor M7 has a source that is coupled to node N212, a drain that is coupled to node N220, and a gate that is coupled to node N216.

Transistor M8 has a source that is coupled to node N214, a drain that is coupled to node N216, and a gate that is coupled to node N216. Transistor M21 has a source that is coupled to a node N202, a drain that is coupled to a node N216, and a gate that is coupled to node N216. Transistor M22 has a source that is coupled to a supply node N200, a drain that is coupled to node a N206, and a gate that is coupled to a node N208. Transistor M23 has a source that is coupled to node N200, a drain that is coupled to a node N210, and a gate that is coupled to node N208.

Transistor X0 has a collector that is coupled to a node N218, an emitter that is coupled to a node N226, and a base that is coupled to a node N228. Transistor X1 has a collector that is coupled to node N220, an emitter that is coupled to a node N230, and a base that is coupled to a node N232. Transistor X36 has a collector that is coupled to node N230, an emitter that is coupled to a node N250, and a base that is coupled to node N248. Transistor X37 has a collector that is coupled to node N226, an emitter that is coupled to a node N246, and a base that is coupled to node N248.

Transistor X62A has a collector that is coupled to node N268, an emitter that is coupled to a node N272, and a base that is coupled to node N268. Transistor X62B has a collector that is coupled to node N270, an emitter that is coupled to a node N274, and a base that is coupled to node N270. Transistor X75A has a collector that is coupled to a node N266 (see FIG. 5), an emitter that is coupled to node N268, and a base that is coupled to node N266. Transistor X75B has a collector that is coupled to node N266, an emitter that is coupled to node N270, and a base that is coupled to node N266.

Transistor X80 has a collector that is coupled to node N218, an emitter that is coupled to node N220, and a base that is coupled to node N218. Transistor X81 has a collector that is coupled to node N220, an emitter that is coupled to node N218, and a base that is coupled to node N220. Transistor X104 has a collector that is coupled to node N206, an emitter that is coupled to a node N222, and a base that is coupled to node N206. Transistor X105 has a collector that is coupled to node N210, an emitter that is coupled to a node N224, and a base that is coupled to node N210. Transistor X106 has a collector that is coupled to a node N242, an emitter that is coupled to node N258, and a base that is coupled to node N242.

Input degeneration resistor R4 has a first terminal coupled to node N226 and a second terminal coupled to node N230. Resistor R10A has a first terminal coupled to node N226 and a second terminal coupled to a node N234. Resistor R10B has a first terminal coupled to node N234 and a second terminal coupled to a node N236. In example embodiments, node N236 corresponds to the OUTN output terminal of the first pre-amplifier 110.

Resistor R11A has a first terminal coupled to node N230 and a second terminal coupled to a node N238. Resistor R11B has a first terminal coupled to node N238 and a second terminal coupled to a node N240. In example embodiments, node N240 corresponds to the OUTP output terminal of the first pre-amplifier 110. Resistor R13A has a first terminal coupled to node N272 and a second terminal coupled to node N262. Resistor R13B has a first terminal coupled to node N274 and a second terminal coupled to node N262. Resistor R32 has a first terminal coupled to node N200 and a second terminal coupled to node N204. Resistor R34 has a first terminal coupled to node N200 and a second terminal coupled to node N214.

Resistor R36 has a first terminal coupled to node N200 and a second terminal coupled to node N212. Resistor R37 has a first terminal coupled to node N200 and a second terminal coupled to node N202. Resistor R48 has a first terminal coupled to node N222 and a second terminal coupled to node N218. Resistor R49 has a first terminal coupled to node N224 and a second terminal coupled to node N220. Resistor R52 has a first terminal coupled to node N228 and a second terminal coupled to a node N229. In example embodiments, node N229 corresponds to the INP output terminal of the first pre-amplifier 110.

Resistor R53 has a first terminal coupled to node N232 and a second terminal that is coupled to a node N233. In example circuit implementation embodiments, node N233 corresponds to the INN output terminal of the first pre-amplifier 110. Resistor R59 has a first terminal coupled to node N250 and a second terminal coupled to node N262. Resistor R60 has a first terminal coupled to node N246 and a second terminal coupled to node N262. Resistor R61 has a first terminal coupled to node N242 and a second terminal coupled to node N244.

FIG. 5. illustrates an example second stage of circuit implementation 400 that is configured as a second differential pair amplification stage and an output stage. Example second stage comprises a plurality of transistors M0, M1, M11, M12, M13, M18, X21, X22, X26, X31, X32, X33, X52, X53, X54, X55, X56, X57, X64, X65, X68, X69, X71, X72, X96, X97, X98, X99, a plurality of resistors R0, R1, R2, R6, R7, R8, R9, R15, R19, R23, R24, R25, R26, R30, R31, R38, R39, R40, R42, R43, R59, R61, R62, R63A, R63B, R67, R68, and a plurality of capacitors C0, C1.

Transistor M0 has a source that is coupled to a node N326, a drain that is coupled to a node N314, and a gate that is coupled to disable control node N264. Transistor M1 has a source that is coupled to a ground node N262, a drain that is coupled to a node N324, and a gate that is coupled to disable control node N264. Transistor M1 has a source that is coupled to supply node N200, a drain that is coupled to a node N282, and a gate that is coupled to a bias node N280. Transistor M12 has a source that is coupled to node N200, a drain that is coupled to a node N278, and a gate that is coupled to node N280. Transistor M13 has a source that is coupled to node N200, a drain that is coupled to node N280, and a gate that is coupled to node N280. Transistor M18 has a source that is coupled to node N200, a drain that is coupled to node N280, and a gate that is coupled to node N280.

Transistor X21 has a collector that is coupled to node N278, an emitter that is coupled to a node N308, and a base that is coupled to a node N300. Transistor X22 has a collector that is coupled to node N282, an emitter that is coupled to a node N312, and a base that is coupled to a node N306. Transistor X26 has a collector that is coupled to a node N296, an emitter that is coupled to node N300, and a base that is coupled to node N296. Transistor X31 has a collector that is coupled to a node N298, an emitter that is coupled to node N306, and a base that is coupled to node N298. Transistor X32 has a collector that is coupled to node N276, an emitter that is coupled to node N298, and a base that is coupled to node N220. Transistor X33 has a collector that is coupled to node N276, an emitter that is coupled to node N296, and a base that is coupled to node N218.

Transistor X52 has a collector that is coupled to node N300, an emitter that is coupled to a node N320, and a base that is coupled to node N316. Transistor X53 has a collector that is coupled to node N306, an emitter that is coupled to node N334, and a base that is coupled to a node N316. Transistor X54 has a collector that is coupled to node N316, an emitter that is coupled to a node N318, and a base that is coupled to node N316. Transistor X55 has a collector that is coupled to a node N284, an emitter that is coupled to a node N290, and a base that is coupled to node N278. Transistor X56 has a collector that is coupled to node N284, an emitter that is coupled to a node N292, and a base that is coupled to node N282. Transistor X57 has a collector that is coupled to node N308, an emitter that is coupled to a node N322, and a base that is coupled to a node N324.

Transistor X64 has a collector that is coupled to node N324, an emitter that is coupled to a node N330, and a base that is coupled to node N324. Transistor X65 has a collector that is coupled to node N312, an emitter that is coupled to a node N332, and a base that is coupled to node N324. Transistor X68 has a collector that is coupled to node N290, an emitter that is coupled to node N236, and a base that is coupled to node N290. Transistor X69 has a collector that is coupled to node N292, an emitter that is coupled to node N240, and a base that is coupled to node N292.

Transistor X71 has a collector that is coupled to node N316, an emitter that is coupled to a node N336, and a base that is coupled to node N316. Transistor X72 has a collector that is coupled to node N324, an emitter that is coupled to a node N328, and a base that is coupled to node N324. Transistor X96 has a collector that is coupled to node N236, an emitter that is coupled to a node N346, and a base that is coupled to a node N340. Transistor X97 has a collector that is coupled to node N240, an emitter that is coupled to a node N348, and a base that is coupled to node N340. Transistor X98 has a collector that is coupled to a node N342, an emitter that is coupled to a node N350, and a base that is coupled to node N340. Transistor X99 has a collector that is coupled to node N340, an emitter that is coupled to a node N344, and a base that is coupled to node N340.

Resistor R0 has a first terminal coupled to node N282 and a second terminal coupled to node N292. Resistor R1 has a first terminal coupled to node N278 and a second terminal coupled to node N290. Resistor R2 has a first terminal coupled to node N200 and a second terminal coupled to node N284. Resistor R6 has a first terminal coupled to node N348 and a second terminal coupled to node N262. Resistor R7 has a first terminal coupled to node N346 and a second terminal coupled to node N262. Resistor R8 has a first terminal coupled to node N344 and a second terminal coupled to node N262.

Resistor R9 has a first terminal coupled to node N350 and a second terminal coupled to node N262. Resistor R15 has a first terminal coupled to node N266 and a second terminal coupled to node N306. Resistor R19 has a first terminal coupled to node N300 and a second terminal coupled to node N266. Resistor R23 has a first terminal coupled to node N322 and a second terminal coupled to node N262. Resistor R24 has a first terminal coupled to node N236 and a second terminal coupled to node N314. Resistor R25 has a first terminal coupled to node N314 and a second terminal coupled to node N240. Resistor R26 has a first terminal coupled to node N332 and a second terminal coupled to node N262.

Resistor R30 has a first terminal coupled to node N336 and a second terminal coupled to node N262. Resistor R31 has a first terminal coupled to node N328 and a second terminal coupled to node N262. Resistor R38 has a first terminal coupled to node N330 and a second terminal coupled to node N262. Resistor R39 has a first terminal coupled to node N342 and a second terminal coupled to node N258. Resistor R40 has a first terminal coupled to node N258 and a second terminal coupled to node N340. Resistor R42 has a first terminal coupled to node N308 and a second terminal coupled to node N310.

Resistor R43 has a first terminal coupled to node N310 and a second terminal coupled to node N312. Resistor R59 has a first terminal coupled to node N320 and a second terminal coupled to node N262. Resistor R61 has a first terminal coupled to node N294 and a second terminal coupled to node N220. Resistor R62 has a first terminal coupled to node N218 and a second terminal coupled to node N288. Resistor R63A has a first terminal coupled to node N200 and a second terminal coupled to node N276. Resistor R63B has a first terminal coupled to node N200 and a second terminal coupled to node N276. Resistor R67 has a first terminal coupled to node N334 and a second terminal coupled to node N262. Resistor R68 has a first terminal coupled to node N318 and a second terminal coupled to node N262.

Capacitor C0 has a first terminal coupled to node N288 and a second terminal coupled to node N278. Capacitor C1 has a first terminal coupled to node N282 and a second terminal coupled to node N294.

Example circuit implementation 400 of first pre-amplifier 110 as shown in FIG. 4 and FIG. 5 is configured to operate as follows. Preliminarily, as described above, a pre-amplifier in the active mode amplifies a differential input signal and further outputs a first dc voltage level. In contrast, a disabled pre-amplifier is placed into a standby ready mode that maintains safe transistor operating points (for example, by keeping internal low voltage devices in a safe operating region), thereby preventing internal voltage drift and minimizing non-ideal loading effects as the differential input signal always remains connected to each respective pre-amplifier. The disabled pre-amplifier additionally outputs a second dc voltage level that is greater in magnitude than the first dc voltage level.

According to the principles of the present disclosure, the following operations are performed to place circuit implementation 400 into a standby ready mode. M3 is switched "off" and M2 switched "on" to disable input stage common-mode feedback. Additionally, transistor M0 is turned "off" and transistor M1 is turned "on" to disable the output stage common-mode feedback. Simultaneously, transistors M22 and M23 are turned "on" and the current mirrors that drive input transistors X0 and X1 are disabled. This places the collector of each respective transistor X0, X1 at a voltage VCC-(VBE-VR), where (VR) equals a voltage drop across R48 or R49, respectively. This protects X0 and X1 from full supply voltage.

Transistors X0 and X1 are not completely turned off; rather X0 and X1 are switched to a low current state in which a small "keep-alive" current is flowing through X0 and X1 to prevent non-linear base current flow, which would result if X0 and X1 were completely turned-off. This is desirable since the differential input signal (VIN) is always applied to the inputs of both a disabled and an enabled pre-amplifier, otherwise, said non-linear base current may flow at X0 and X1 due to capacitive coupling, and therefore potentially distort (VIN) and/or load the enabled pre-amplifier. In certain embodiments, almost all the biasing currents supplied to example circuit implementation 400 are switched off, except for current supplied from third bias current output terminal 432, which is switched from sourcing approximately 2.2 mA in the active mode to sourcing approximately 5 uA in the standby ready mode.

As mentioned, both the enabled and disabled pre-amplifiers output a predefined dc voltage level. The second dc voltage level of a disabled pre-amplifier is evaluated as follows. In the standby ready mode, the base of transistor X33 is coupled to the collector of X0 and is therefore at a voltage (VCC)-(VBE-VR). Moving from the base of transistor X33 to the collector of transistor X26 places said collector at a voltage (VCC)-(VBE-VR)-VBE. Moving from the collector of transistor X26 to the base of transistor X21 (biased in reverse mode) places said base at a voltage (VCC)-(VBE-VR)-2VBE. Moving from the base of transistor X21 to the base of X55 places said base at a voltage (VCC)-(VBE-VR)-2VBE-VBC. Moving from the base of transistor X55 to the emitter of X68 (OUTN terminal) places said emitter at a voltage (VCC)-(VBE-VR)-4VBE-VBC. In example embodiments, this sets the output dc voltage to approximately 1.9V. A similar procedure can be followed proceeding from the collector of transistor X1 to the OUTP terminal. In the active mode, the output dc is set approximately to 1.2V.

Figure 6:
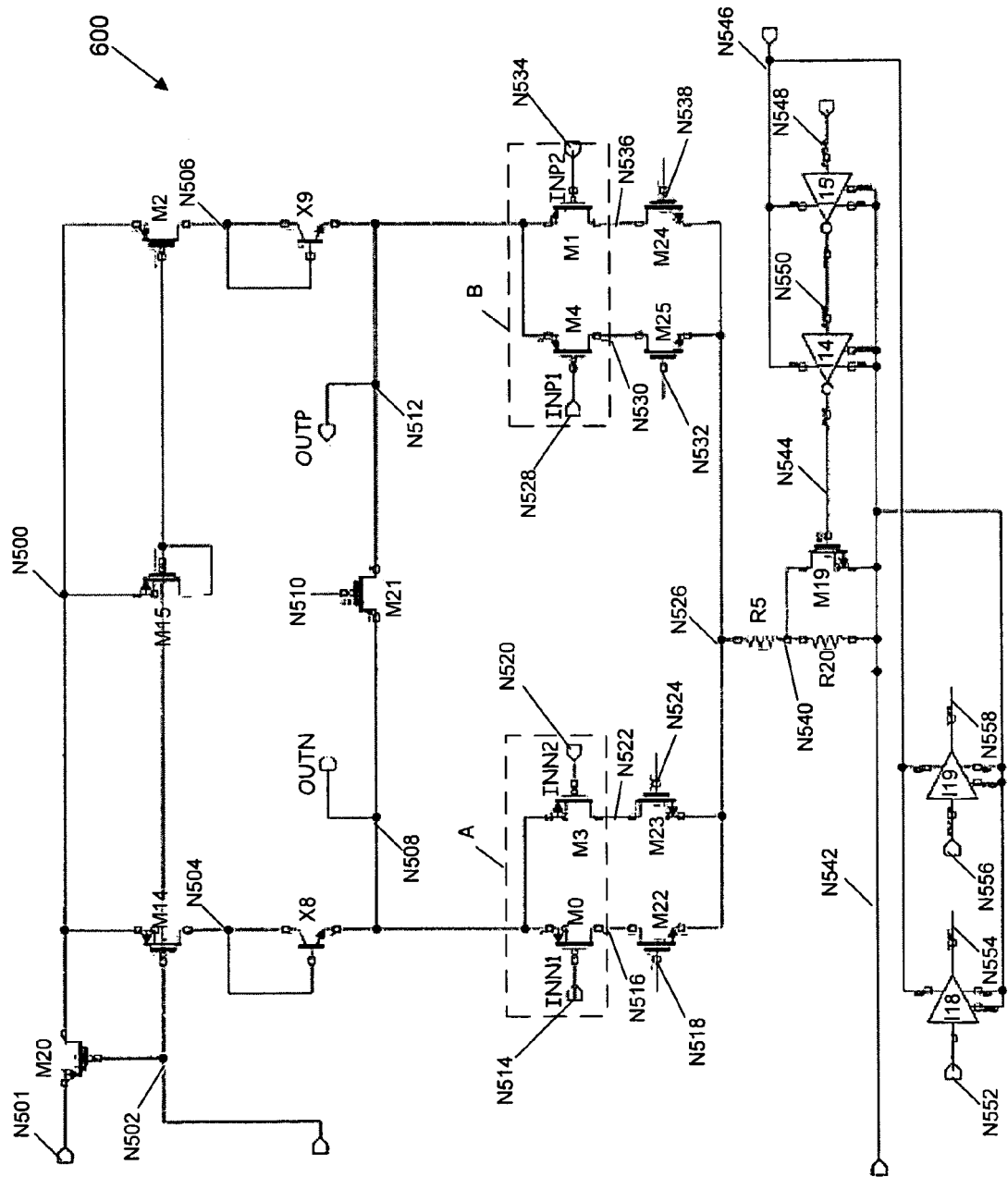
FIG. 6 is a schematic diagram of an example circuit implementation of a level shifter stage of FIG. 1.

Referring now to FIG. 6, a schematic diagram of an example circuit implementation 600 of level shifter stage 104 of FIG. 1 is shown. Example circuit implementation 600 comprises a plurality of transistors M0, M1, M2, M3, M4, M14, M15, M19, M20, M21, M22, M23, M24, M25, X8, X9, a plurality of resistors R5, R20, and a plurality of invertors I14, I15, I18, I19.

Transistor M0 has a source that is coupled to a node N508, a drain that is coupled to a node N516, and a gate that is coupled to a node N514 that corresponds to INN1 input terminal of level shifter stage 104. Transistor M1 has a source that is coupled to a node N512, a drain that is coupled to a node N536, and a gate that is coupled to a node N534 that corresponds to INP2 input terminal of level shifter stage 104. Transistor M2 has a source that is coupled to a supply node N500, a drain that is coupled to a node N506, and a gate that is coupled to a supply node N502.

Transistor M3 has a source that is coupled to node N508, a drain that is coupled to a node N522, and a gate that is coupled to a node N520 that corresponds to INN2 input terminal of level shifter stage 104. Transistor M4 has a source that is coupled to node N512, a drain that is coupled to a node N530, and a gate that is coupled to a node N528 that corresponds to INP1 input terminal of level shifter stage 104. Transistor M14 has a source that is coupled to node N500, a drain that is coupled to a node N504, and a gate that is coupled to node N502. Transistor M15 has a source that is coupled to node N500, a drain that is coupled to a node N502, and a gate that is coupled to node N502.

Transistor M19 has a source that is coupled to a node N542, a drain that is coupled to a node N540, and a gate that is coupled to a node N544. Transistor M20 has a source that is coupled to a supply node N501, a drain that is coupled to node N500, and a gate that is coupled to node N502. Transistor M21 has a source that is coupled to a node N508 that corresponds to OUTN output terminal of level shifter stage 104, a drain that is coupled to node N512 that corresponds to OUTP output terminal of level shifter stage 104, and a gate that is coupled to a control node N510.

Transistor M22 has a source that is coupled to a node N526, a drain that is coupled to a node N516, and a gate that is coupled to a node N518. Transistor M23 has a source that is coupled to node N526, a drain that is coupled to node N522, and a gate that is coupled to a node N524. Transistor M24 has a source that is coupled to node N526, a drain that is coupled to a node N536, and a gate that is coupled to a node N538. Transistor M25 has a source that is coupled to node N526, a drain that is coupled to node N530, and a gate that is coupled to a node N532.

Transistor X8 has a collector that is coupled to a node N504, an emitter that is coupled to a node N508, and a base that is coupled to node N504. Transistor X9 has a collector that is coupled to a node N506, an emitter that is coupled to a node N512, and a base that is coupled to node N506.

Resistor R5 has a first terminal coupled to node N526 and a second terminal coupled to node N540. Resistor R20 has a first terminal coupled to node N540 and a second terminal coupled to node N542.

Inverter I14 has a first terminal coupled to node N544 and a second terminal coupled to node N550. Inverter I15 has a first terminal coupled to node N550 and a second terminal coupled to a node N548. Inverter I18 has a first terminal coupled to node N552 and a second terminal coupled to node N554. Inverter I19 has a first terminal coupled to node N556 and a second terminal coupled to node N558.

Example circuit implementation 600 of level shifter stage 104 is configured to operate as follows. Transistors M14, M15 and M2 are configured as a current mirror to supply current to transistors X8 and X9. Transistors X8 and X9 protect both transistors M14 and M2 from a large (VDS), and further pass a constant current into the source node of the PMOS differential input pair "A" formed by transistors M0, M3, and the PMOS differential input pair "B" formed by transistors M4, M1, respectively. In example embodiments, the configuration of the differential input pairs "A" and "B" provides a minimum voltage selection mechanism to automatically select the differential input signal (VIN), and further level shifts the differential input signal (VIN).

For example, when second pre-amplifier 116 is placed in the standby ready mode, the dc output voltage of second pre-amplifier 116 is set to approximately 1.9V while the dc output voltage of first pre-amplifier 110 is set to approximately 1.2V. Accordingly, input terminal INN1 (node N514) of transistor M0 and input terminal INP1 (node N528) of transistor M4 are set to 1.2V, and input terminal INN2 (node N520) of transistor M3 and input terminal INP2 (node N534) of transistor M1 are set to 1.9V. In example embodiments, the 1.2V is of sufficient magnitude to turn PMOS transistor M0 and PMOS transistor M4 on. In this manner, the differential input signal (VIN) as passed by the first pre-amplifier 110 is transferred to the output terminals (OUTN and OUTP) of level shifter stage 104, and dc level shifted (by |VGS|). The level shifted, amplified differential input signal (VIN) is then passed to the input terminals (INN and INP) of the output amplifier stage 106.

Figure 7:
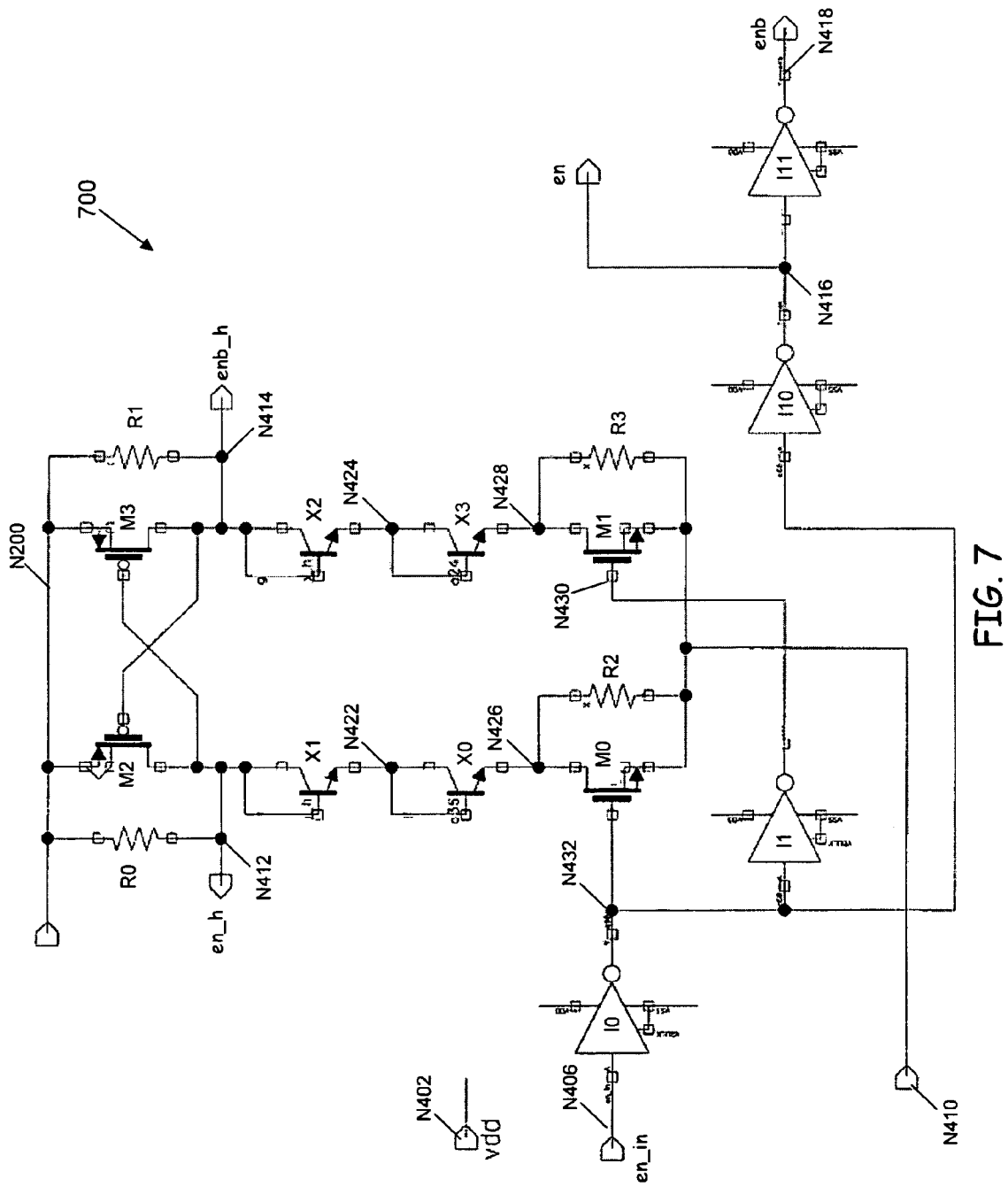
FIG. 7 is a schematic diagram of an example circuit implementation of a logic level translation circuit of an example amplifier block as shown in FIG. 1.

Referring now to FIG. 7, a schematic diagram of an example circuit implementation 700 of first biasing block 402 of FIG. 4 is shown. Example circuit implementation 700 comprises a plurality of transistors M0, M1, M2, M3, X0, X1, X2, X3, a plurality of resistors R0, R1, R2, R3, and a plurality of invertors I0, I1, I10, I1.

Transistor M0 has a source that is coupled to a ground node N262, a drain that is coupled to a node N426, and a gate that is coupled to a node N432. Transistor M1 has a source that is coupled to node N414, a drain that is coupled to a node N428, and a gate that is coupled to a node N430. Transistor M2 has a source that is coupled to a supply node N200, a drain that is coupled to a node N412 that corresponds to en_h output terminal 412 of enable shift, and a gate that is coupled to a node N414 that corresponds to enb_h output terminal 414. Transistor M3 has a source that is coupled to supply node N200, a drain that is coupled to a node N414, and a gate that is coupled to node N412.

Transistor X0 has a collector that is coupled to a node N422, an emitter that is coupled to a node N426, and a base that is coupled to node N422. Transistor X1 has a collector that is coupled to a node N412, an emitter that is coupled to a node N422, and a base that is coupled to node N412. Transistor X2 has a collector that is coupled to a node N414, an emitter that is coupled to a node N424, and a base that is coupled to node N414. Transistor X3 has a collector that is coupled to a node N424, an emitter that is coupled to a node N428, and a base that is coupled to node N424.

Resistor R0 has a first terminal coupled to node N200 and a second terminal coupled to node N412. Resistor R1 has a first terminal coupled to node N200 and a second terminal coupled to node N414. Resistor R2 has a first terminal coupled to node N426 and a second terminal coupled to node N410. Resistor R3 has a first terminal coupled to node N428 and a second terminal coupled to node N410.

Inverter I0 has a first terminal coupled to node N406 that corresponds to en_in terminal 406 of first biasing block 402 and a second terminal coupled to node N432. Inverter I1 has a first terminal coupled to node N432 and a second terminal coupled to node N430. Inverter I10 has a first terminal coupled to node N432 and a second terminal coupled to node N416 that corresponds to en output terminal 416 of first biasing block 402. Inverter I11 has a first terminal coupled to node N416 and a second terminal coupled to node N418 that corresponds to enb output terminal 418 of first biasing block 402.

Example circuit implementation 700 is configured to operate as follows. In example embodiments, example CMOS switches incorporated into first pre-amplifier 110, second pre-amplifier 116, and output amplifier stage 106 are referenced to a 5V power supply (i.e., VCC supply node N200). However, standard logic voltage levels from exterior logic that are referenced to a 3V power supply (i.e., VDD supply node N402) are applied at node N406. Example circuit implementation 700 performs a logic level shift to translate logic levels from 0 to 3.3 volts to 1.7 to 5V.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A digitally variable gain amplifier, comprising:
a front-end amplification stage comprising a plurality of gain blocks, wherein the gain blocks are configured to be driven in parallel by a differential input signal that is continuously connected to input terminals of each gain block during amplifier operation;
a selection stage configured to receive a signal from each gain block during amplifier operation; and
an output stage configured to receive and condition a differential signal from the selection stage;
wherein one gain block of the plurality of gain blocks is configured to be placed in an active mode to amplify the differential input signal and each remaining gain block of the plurality of gain blocks is configured to be placed in a standby ready mode, and wherein the selection stage is configured to automatically select the amplified differential input signal from the one gain block that is in the active mode from the received signals.

2. The digitally variable gain amplifier of claim 1, wherein the one gain block in the active mode is configured to transmit a first dc voltage level to the selection stage, and wherein each remaining gain block of the plurality of gain blocks is configured to transmit a second dc voltage level to the selection stage.

3. The digitally variable gain amplifier of claim 1, wherein each of the plurality of gain blocks is configured with a current feedback loop to feed current from that gain block's low impedance output terminals to that gain block's input terminals, and wherein a gain of each gain block is uniquely set by a ratio of an input degeneration resistor and feedback resistors.

4. The digitally variable gain amplifier of claim 1, wherein each of the plurality of gain blocks further comprise a first biasing block configured to level shift a logic voltage level and a second biasing block configured to supply a bias current to that gain block, the bias current having a magnitude that is specific to that gain block's mode.

5. The digitally variable gain amplifier of claim 1, wherein each gain block in the standby ready mode has a disabled input stage common-mode feedback loop, a disabled output stage common-mode feedback loop, and a bias current supplied to an input differential pair that is switched to a low bias current state.

6. The digitally variable gain amplifier of claim 2, wherein the second dc voltage level is different in magnitude than the first dc voltage level, and wherein the selection stage comprises a level shifter stage that is configured to automatically select the amplified differential input signal for transmission to the output stage by performing one of: a minimum voltage detection operation and a maximum voltage detection operation.

7. The digitally variable gain amplifier of claim 6, further comprising a plurality of gain adjustable attenuators each coupled to one of the plurality of gain blocks, wherein each attenuator is configured to receive the signal from a corresponding gain block and transfer the signal to the level shifter stage.

8. The digitally variable gain amplifier of claim 6, wherein the level shifter stage is configured to automatically adjust the first dc voltage level of the amplified differential input signal to condition the signal for the output stage.

9. The digitally variable gain amplifier of claim 5, wherein the low bias current state maintains an operating point of the input differential pair to prevent a non-linear base current flow.

10. A digitally variable gain amplifier using multiplexed gain blocks, comprising:
a front-end amplification stage comprising a plurality of gain blocks, wherein the gain blocks are driven in parallel by a differential input signal that is connected to input terminals of each gain block for a duration of amplifier operation;
a selection stage configured to receive an input signal from each gain block during amplifier operation; and
an output stage configured to receive a differential signal from the selection stage;
wherein one gain block of the plurality of gain blocks is configured to be placed in an active mode to amplify and transmit the differential input signal and a first dc voltage level to the selection stage and each remaining gain block of the plurality of gain blocks is configured to be simultaneously placed in a standby ready mode to disable signal amplification, wherein a disabled gain block is configured to transmit a second dc voltage level to the selection stage, and wherein the selection stage is configured to automatically select the amplified differential input signal from all received signals for transmission to the output stage.

11. The digitally variable gain amplifier of claim 10, wherein the second dc voltage level is different in magnitude than the first dc voltage level, and wherein the selection stage comprises a level shifter stage that is configured to automatically select the amplified differential input signal for transmission to the output stage by performing one of: a minimum voltage detection operation and a maximum voltage detection operation.

12. The digitally variable gain amplifier of claim 10, wherein the selection stage is configured to automatically adjust the first dc voltage level of the amplified differential input signal to condition the signal for the output stage.

13. The digitally variable gain amplifier of claim 10, further comprising a plurality of attenuators each coupled to one of the plurality of gain blocks, wherein each attenuator is configured to receive the signal from a corresponding gain block and transfer the signal to the level shifter stage, and wherein a control signal is applied to a plurality of fine gain set terminals of each attenuator to set an attenuator gain.

14. The digitally variable gain amplifier of claim 10, wherein each of the plurality of gain blocks is configured with a current feedback loop to feed current from that gain block's low impedance output terminals to that gain block's input terminals, and wherein a gain of each gain block is uniquely set by a ratio of an input degeneration resistor and feedback resistors.

15. The digitally variable gain amplifier of claim 10, wherein each of the plurality of gain blocks further comprises a first biasing block and a second biasing block, wherein the first biasing block is configured to level shift a logic voltage level and the second biasing block is configured to supply a bias current to that gain block, the bias current having a magnitude that is specific to that gain block's mode.

16. The digitally variable gain amplifier of claim 10, wherein each gain block in the standby ready mode has a disabled input stage common-mode feedback loop, a disabled output stage common-mode feedback loop, and a bias current supplied to an input differential pair that is switched to a low bias current state, and wherein internal low voltage devices are configured to be automatically placed in a safe operating protected mode.

17. The digitally variable gain amplifier of claim 10, wherein the amplifier comprises devices fabricated using a BiCMOS process.

18. The digitally variable gain amplifier of claim 11, wherein the first dc voltage level is approximately 1.2V and the second dc voltage level is approximately 1.9V.

19. The digitally variable gain amplifier of claim 11, wherein the output stage comprises an amplification stage configured to amplify the amplified differential input signal received from the selection stage.

20. The digitally variable gain amplifier of claim 16, wherein the low bias current state maintains an operating point of the input differential pair to prevent a non-linear base current flow.

* * * * *